United States Patent
Hosoda (10) Patent No.: US 11,075,606 B2
(45) Date of Patent: Jul. 27, 2021

(54) POWER AMPLIFIER CIRCUIT AND ANTENNA DEVICE

(71) Applicant: FUJITSU LIMITED, Kawasaki (JP)

(72) Inventor: Masayuki Hosoda, Asaka (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/781,172

(22) Filed: Feb. 4, 2020

(65) Prior Publication Data

US 2020/0266772 A1 Aug. 20, 2020

(30) Foreign Application Priority Data

Feb. 14, 2019 (JP) ............... JP2019-024662

(51) Int. Cl.
*H04B 1/04* (2006.01)
*H03F 1/32* (2006.01)
*H03F 3/21* (2006.01)
*H04B 1/40* (2015.01)

(52) U.S. Cl.
CPC ............ *H03F 1/3241* (2013.01); *H03F 3/21* (2013.01); *H04B 1/40* (2013.01); *H03F 2200/451* (2013.01); *H03F 2201/3215* (2013.01)

(58) Field of Classification Search
CPC .......... H04B 1/40; H04B 1/04; H04B 1/0475; H04B 2001/0408; H03F 1/32; H03F 3/21
See application file for complete search history.

(56) References Cited

U.S. PATENT DOCUMENTS

| | | | |
|---|---|---|---|
| 10,305,435 B1* | 5/2019 | Murugesu | H03F 1/3258 |
| 2017/0163217 A1* | 6/2017 | Bonebright | H03F 3/245 |
| 2018/0053997 A1 | 2/2018 | Noto et al. | |
| 2018/0262220 A1* | 9/2018 | Jimenez | H04B 1/04 |
| 2020/0366202 A1* | 11/2020 | Petrovic | H03F 1/0266 |

FOREIGN PATENT DOCUMENTS

WO 2016/167145 A1 10/2016

\* cited by examiner

*Primary Examiner* — Blane J Jackson
(74) *Attorney, Agent, or Firm* — Westerman, Hattori, Daniels & Adrian, LLP (57) ABSTRACT

A power amplifier circuit includes a plurality of amplifiers, a detector configured to detect distortion characteristics of each of the plurality of amplifiers, a control circuit configured to control a bias voltage to be applied to at least one amplifier of the plurality of amplifiers so that the distortion characteristics of each of the plurality of amplifiers detected by the detector are matched, and a distortion compensator configured to perform distortion compensation for the plurality of amplifiers, based on the distortion characteristics of each of the plurality of amplifiers detected by the detector.

11 Claims, 7 Drawing Sheets

POWER AMPLIFIER CIRCUIT AND ANTENNA DEVICE

CROSS-REFERENCE TO RELATED APPLICATION

This application is based upon and claims the benefit of priority of the prior Japanese Patent Application No. 2019-24662, filed on Feb. 14, 2019, the entire contents of which are incorporated herein by reference.

FIELD

The embodiments discussed herein are related to a power amplifier circuit and an antenna device.

BACKGROUND

There is known an antenna device including a distortion compensation unit configured to compensate for distortion caused by a plurality of power amplifiers, by multiplying a baseband signal by a predistortion signal that gives distortion characteristics opposite to the distortion characteristics of a signal emitted from an array antenna (see, for example, International Publication Pamphlet No. WO 2016/167145).

SUMMARY

According to an aspect of the embodiments, a power amplifier circuit includes a plurality of amplifiers, a detector configured to detect distortion characteristics of each of the plurality of amplifiers, a control circuit configured to control a bias voltage to be applied to at least one amplifier of the plurality of amplifiers so that the distortion characteristics of each of the plurality of amplifiers detected by the detector are matched, and a distortion compensator configured to perform distortion compensation for the plurality of amplifiers, based on the distortion characteristics of each of the plurality of amplifiers detected by the detector.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

In a case where there is a variation in distortion characteristics of each of a plurality of amplifiers, distortion may remain in a signal outputted from each of the plurality of amplifiers even when distortion compensation is performed.

Hereinafter, embodiments of techniques able to reduce distortion generated in an output signal of each of a plurality of amplifiers, will be described with reference to the drawings.

Figure 1:
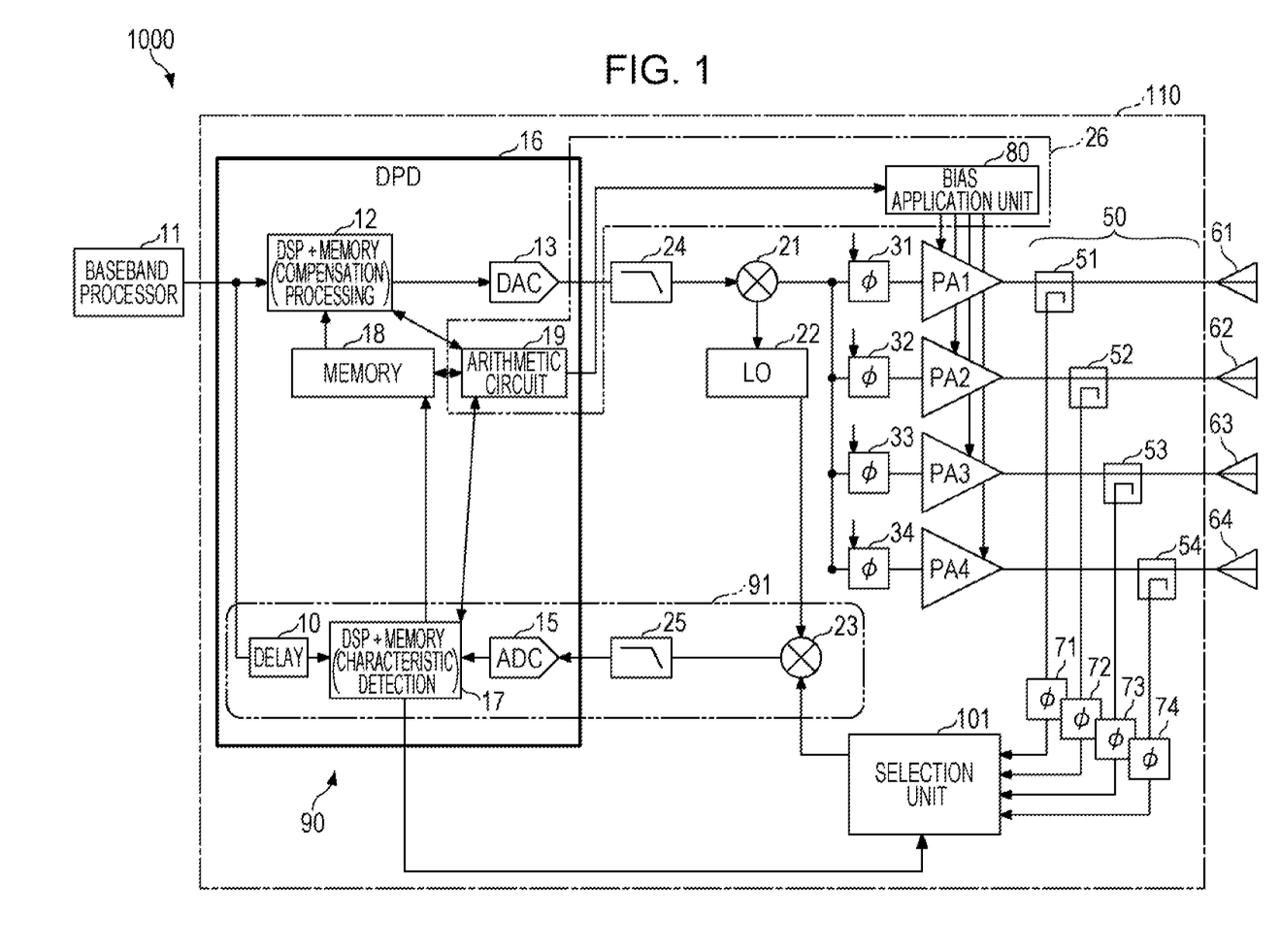
FIG. 1 is a diagram illustrating a configuration example of an antenna device according to a first embodiment.

FIG. 1 is a diagram illustrating a configuration example of an antenna device according to an embodiment of the present disclosure. An antenna device 1000 illustrated in FIG. 1 uses an array antenna technique, a multi-level modulation technique, and a distortion compensation technique of a power amplifier in order to achieve wireless transmission of high data capacity and long distance.

The array antenna technique is a technique in which output power from a power amplifier (PA) is emitted from a plurality of antennas arranged in array form, so that the directivity of radio waves is improved by making use of interference between the radio waves output from the plurality of antennas. By utilizing the array antenna technique, communication over a longer distance may be carried out with the same power.

Furthermore, by coupling a plurality of power amplifiers to each of the plurality of antennas, it is possible to emit, into the air, amounts of power that a single power amplifier is unable to handle. As a result, it is possible to configure a transmitter of high directivity and large output, so that communication of a longer distance may be carried out.

The multi-level modulation technique is a technique for communicating with a higher data capacity within a given frequency band, by combining amplitude modulations, phase modulations, or both the amplitude and phase modulations. Since the amplitude or phase of the radio waves to be transmitted is divided into multiple stages and a large number of codes are allocated to them to carry out the communication, correct code transmission may not be made in some case due to an error in the amplitude or phase. With the progress of the multi-level modulation, an allowable error is required to be small in order to achieve error-free communication.

The PA is an amplifier for generating a radio wave of high power to be output from the antenna, and an output waveform of the PA generally has distortion. In consideration of using a PA of the same rating, the output is small when used in a range where the distortion is small, but when it is attempted to obtain a large output, the distortion is likely to become large. When the distortion becomes large, an error rate (bit error rate (BER)) of the transmission codes in the modulation is increased, and an adjacent channel leakage power ratio (ACPR) is also increased, thereby causing deterioration in communication quality.

The allowable leakage power to adjacent channels is regulated by law. Therefore, a distortion compensation technique is generally applied to a PA for achieving wireless transmission over a long distance.

As an example of a distortion compensation technique applied to an antenna device using the array antenna technique, there exists a technique configured to perform distortion compensation based on an output composite waveform to the array antenna, and a technique configured to perform distortion compensation on each individual PA.

The former technique is able to appropriately reduce distortion with respect to a composite output that is output in the main beam direction from the array antenna. However, when there is a variation in characteristics of each PA, distortion is not reduced with respect to a composite output in a direction of a sideband (also referred to as a side lobe), and there is a risk that the distortion is increased depending on conditions.

The latter technique is easy to achieve an adequate distortion reduction regardless of beam directions. However, since distortion compensation blocks of the same number as that of the PAs are provided, there is a concern that the circuit size, power consumption, and the like may increase, or that the power utilization efficiency of the whole system may be significantly lowered. For example, in the communication of high data capacity, a digital predistortion technique is normally used, in which a high-speed analog-to-digital converter (ADC) and a high-speed arithmetic processing unit are required for detecting and analyzing signal waveforms. Since the power consumption of these units is relatively large, the power consumption of the whole antenna device is also largely increased.

One embodiment according to a technique of the present disclosure provides an amplifier circuit and an antenna device including a smaller number of distortion compensation units than that of PAs in order to suppress power consumption caused by the distortion compensation units. In addition, one embodiment according to the technique of the present disclosure brings a situation in which distortions caused by a plurality of PAs are effectively suppressed with the above smaller number of distortion compensation units.

For example, the antenna device 1000 including a power amplifier circuit 110, as illustrated in FIG. 1, is provided. The antenna device 1000 includes a plurality of antennas (four antennas 61 to 64 in the drawing), and the power amplifier circuit 110 configured to supply power to the plurality of antennas. The power amplifier circuit 110 includes a plurality of PAs (four PAs 1 to 4 in the drawing), and a single distortion compensation unit 16 common to the plurality of PAs.

In the case where the single distortion compensation unit common to the plurality of PAs performs compensation processing collectively for the distortions caused by the PAs, when there is a variation in distortion characteristics of each of the plurality of PAs, there is a risk that the compensation processing for the distortions of the signals output from the plurality of amplifiers may not be sufficiently performed so that some of the distortions may remain in the signals. However, in the case where the distortion characteristics of each of the plurality of PAs are substantially uniform, the distortions of the signals output from the plurality of amplifiers may be sufficiently suppressed even when the single distortion compensation unit 16 common to the plurality of PAs performs distortion compensation processing.

Next, the antenna device 1000 having a configuration for causing the distortion characteristics of each of the plurality of PAs to be uniform will be described in more detail.

The antenna device 1000 includes the power amplifier circuit 110, the plurality of antennas 61 to 64, and a baseband processor 11. The antenna device 1000 transmits radio waves from the plurality of antennas 61 to 64 based on high frequency signals having been amplified by the power amplifier circuit 110. The antenna device 1000 is, for example, a phased array antenna device configured to transmit and/or receive radio waves by a time division duplex (TDD) scheme or a frequency division duplex (FDD) scheme. However, the communication schemes are not limited thereto. Examples of the antenna device 1000 include a radio base station, a mobile phone, a smartphone, and an Internet of Things (IoT) device. However, such examples thereof are not limited thereto.

The antennas 61 to 64 are elements configured to transmit radio waves corresponding to transmission signals (high frequency signals) when the transmission signals having been amplified by the power amplifier circuit 110 are supplied thereto. Each of the antennas 61 to 64 is supplied with a transmission signal having been amplified by the corresponding PA among the plurality of PAs 1 to 4 provided in the output stage of the power amplifier circuit 110.

Although FIG. 1 illustrates an example in which the number of antennas and the number of PAs are respectively four, the technique of the present disclosure is also applicable to cases of other numbers, that is, applicable when the number is equal to or more than two. Moreover, a plurality of, for example, eight PAs may be coupled to a single antenna.

The baseband processor 11 performs, for example, quadrature modulation on transmission data (digital signal) to be transmitted by the antenna device 1000, and outputs a baseband signal, which is a digital signal after quadrature modulation, to the distortion compensation unit 16 of the power amplifier circuit 110. The baseband processor 11 is an example of a baseband signal generating unit configured to generate a baseband signal.

The power amplifier circuit 110 includes the distortion compensation unit 16, filters 24 and 25, an up-converter 21, an oscillator 22, a plurality of phase shifters 31 to 34, the plurality of PAs 1 to 4, a bias application unit 80, an extraction unit 50, a plurality of phase shifters 71 to 74, a selection unit 101, and a down-converter 23.

The distortion compensation unit 16 performs distortion compensation, such as digital predistortion (DPD), on the plurality of PAs 1 to 4. The distortion compensation unit 16 includes a compensation processing unit 12, a digital-to-analog converter (DAC) 13, a memory 18, an arithmetic circuit 19, a delay adjustment section 10, a characteristic detection unit 17, and an analog-to-digital converter (ADC) 15.

The compensation processing unit 12 performs distortion compensation processing on the baseband signal supplied from the baseband processor 11 by using predistortion data such as a distortion compensation coefficient stored in the memory 18, and generates a baseband signal having experienced the distortion compensation processing. The function of the compensation processing unit 12 is enabled by, for example, a digital signal processor (DSP) being operated by a program stored in a memory in a readable manner.

The DAC 13 converts the baseband signal having experienced the distortion compensation processing (the baseband signal after the distortion compensation processing) by the compensation processing unit 12 from digital to analog, and then outputs the analog baseband signal to the up-converter 21 through the filter 24.

The up-converter 21 multiplies the baseband signal supplied from the DAC 13 by a local signal generated by the oscillator 22 to up-convert the analog baseband signal to a high frequency band signal. The oscillator 22 is a local oscillator (LO) configured to generate a local signal of radio frequency. The up-converter 21 outputs the up-converted high frequency signal (transmission signal). The transmission signal outputted from the up-converter 21 is distributed to the plurality of phase shifters 31 to 34 by a distributor (not illustrated).

The phase shifters 31 to 34 are each provided in the front stage of the corresponding PA. Each of the phase shifters 31 to 34 adjusts the phase of the high frequency signal, inputted after the distribution, in accordance with the directivity of each of the antennas 61 to 64. Each of the phase shifters 31 to 34 outputs the high frequency signal after the phase adjustment to the corresponding PA among the plurality of PAs 1 to 4.

Each of the PAs 1 to 4 is an amplifier configured to amplify the power of the high frequency signal supplied from the corresponding phase shifter among the phase shifters 31 to 34. Each of the PAs 1 to 4 amplifies the high frequency signal inputted from the corresponding phase shifter, and outputs the amplified high frequency signal to the corresponding antenna among the plurality of antennas 61 to 64.

The power amplifier circuit 110 includes a detection unit 90 configured to detect distortion characteristics of each of the plurality of PAs 1 to 4. The detection unit 90 illustrated in FIG. 1 includes the extraction unit 50, the phase shifters 71 to 74, the selection unit 101, and a distortion detection unit 91.

The extraction unit 50 extracts a plurality of signals from the respective output signals of the PAs 1 to 4. The extraction unit 50 includes a first directional coupler 51 inserted in a signal line between the PA 1 and the antenna 61, and a second directional coupler 52 inserted in a signal line between the PA 2 and the antenna 62. The extraction unit 50 further includes a third directional coupler 53 inserted in a signal line between the PA 3 and the antenna 63, and a fourth directional coupler 54 inserted in a signal line between the PA 4 and the antenna 64. Each of the directional couplers 51 to 54 extracts part of the signal outputted from each of the PAs 1 to 4, and outputs a feedback signal corresponding to the power of the signal outputted from each of the PAs 1 to 4.

The phase shifters 71 to 74 are each inserted in a signal line between the extraction unit 50 and the selection unit 101, and adjust the phase of each feedback signal supplied from the corresponding directional couplers 51 to 54. The phase shifters 71 to 74 operate complementarily to the corresponding phase shifters 31 to 34. For example, the phase shifter 71 adjusts the phase of the feedback signal supplied from the directional coupler 51 in a direction opposite to the phase shift direction set by the phase shifter 31, with the same phase shift amount as the phase shift amount produced by the phase shifter 31. The same applies to the phase shifters 72 to 74.

The plurality of signals (feedback signals) extracted by the extraction unit 50 are input to the selection unit 101. The selection unit 101 is a circuit configured to sequentially select the plurality of feedback signals one by one, based on a selection signal given from the characteristic detection unit 17 of the distortion detection unit 91.

The distortion detection unit 91 detects distortion characteristics of each of the PAs 1 to 4 by comparing signals selected by the selection unit 101 one by one from among the plurality of feedback signals with the baseband signal (baseband signal before experiencing distortion compensation processing) before being distributed to the PAs 1 to 4. The distortion detection unit 91 includes, for example, the down-converter 23, the filter 25, the ADC 15, the characteristic detection unit 17, and the delay adjustment section 10.

The down-converter 23 multiplies the analog feedback signal supplied from the selection unit 101 by a local signal of baseband frequency generated by the oscillator 22 to down-convert the analog feedback signal to a signal of the baseband. The down-converter 23 generates a down-converted feedback signal, and outputs the generated feedback signal to the ADC 15 through the filter 25.

The ADC 15 sequentially converts the feedback signals sequentially selected by the selection unit 101 one by one from among the plurality of feedback signals, one by one from analog to digital. The digital feedback signal generated by the ADC 15 is supplied to the characteristic detection unit 17. The delay adjustment section 10 adjusts the phase of the baseband signal supplied from the baseband processor 11. The phase-adjusted baseband signal is supplied to the characteristic detection unit 17.

The characteristic detection unit 17 compares the baseband signal supplied from the baseband processor 11 with the feedback signal supplied from the ADC 15 to calculate a difference between the two signals, thereby detecting the distortion characteristics of the PA from which the feedback signal has been extracted. Since the feedback signals sequentially selected by the selection unit 101 one by one from among the plurality of feedback signals are sequentially supplied from the ADC 15, the characteristic detection unit 17 may detect all of the distortion characteristics of the PAs 1 to 4. Since the feedback signals to be compared with the baseband signal are selected by the selection unit 101 one by one, the distortion characteristics of all the PAs may be detected even when the same number of characteristic detection units as that of the plurality of PAs are not provided. That is, the distortion characteristics of all the PAs may be detected while suppressing the circuit scale of the distortion detection unit including the characteristic detection unit. The function of the characteristic detection unit 17 is enabled by, for example, a DSP being operated by a program stored in a memory in a readable manner.

The characteristic detection unit 17 may detect, for example, an AM-AM distortion or AM-PM distortion as the distortion characteristics of the PA. AM is an abbreviation for "Amplitude Modulation", and PM is an abbreviation for "Phase Modulation". The AM-AM distortion represents a shift of the amplitude of a signal outputted from a PA with respect to the amplitude of a signal inputted to the PA. The AM-PM distortion represents a shift of the phase of a signal outputted from a PA with respect to the amplitude of a signal inputted to the PA.

The power amplifier circuit 110 includes a control unit 26 configured to control a bias applied to at least one PA among the PAs 1 to 4 in such a manner as to uniform the distortion characteristics of each of the PAs 1 to 4 detected by the detection unit 90. The control unit 26 illustrated in FIG. 1 includes the arithmetic circuit 19 and the bias application unit 80.

The arithmetic circuit 19 controls the bias applied by the bias application unit 80 to at least one PA among the PAs 1 to 4 in such a manner that the distortion characteristics of each of the PAs 1 to 4 detected by the characteristic detection unit 17 of the detection unit 90 become uniform. The distortion compensation unit 16 performs distortion compensation on the PAs 1 to 4 based on the distortion characteristics of each of the PAs 1 to 4 detected by the characteristic detection unit 17 of the detection unit 90.

As discussed above, the distortion characteristics of each of the PAs 1 to 4 may be made uniform by the bias control performed by the arithmetic circuit 19 and the bias application unit 80. In the case where the distortion characteristics of each of the PAs are substantially uniform, distortions of the signals outputted from each of the plurality of PAs may be sufficiently suppressed even when the single distortion compensation unit 16 (or compensation processing unit 12) common to the plurality of PAs performs distortion compensation. Further, since the distortion compensation unit to perform distortion compensation does not have to be provided independently for each of the plurality of PAs, it is possible to reduce the circuit scale of the distortion compensation unit. As a result, the power amplifier circuit 110 and the antenna device 1000 may be miniaturized.

Figure 2:
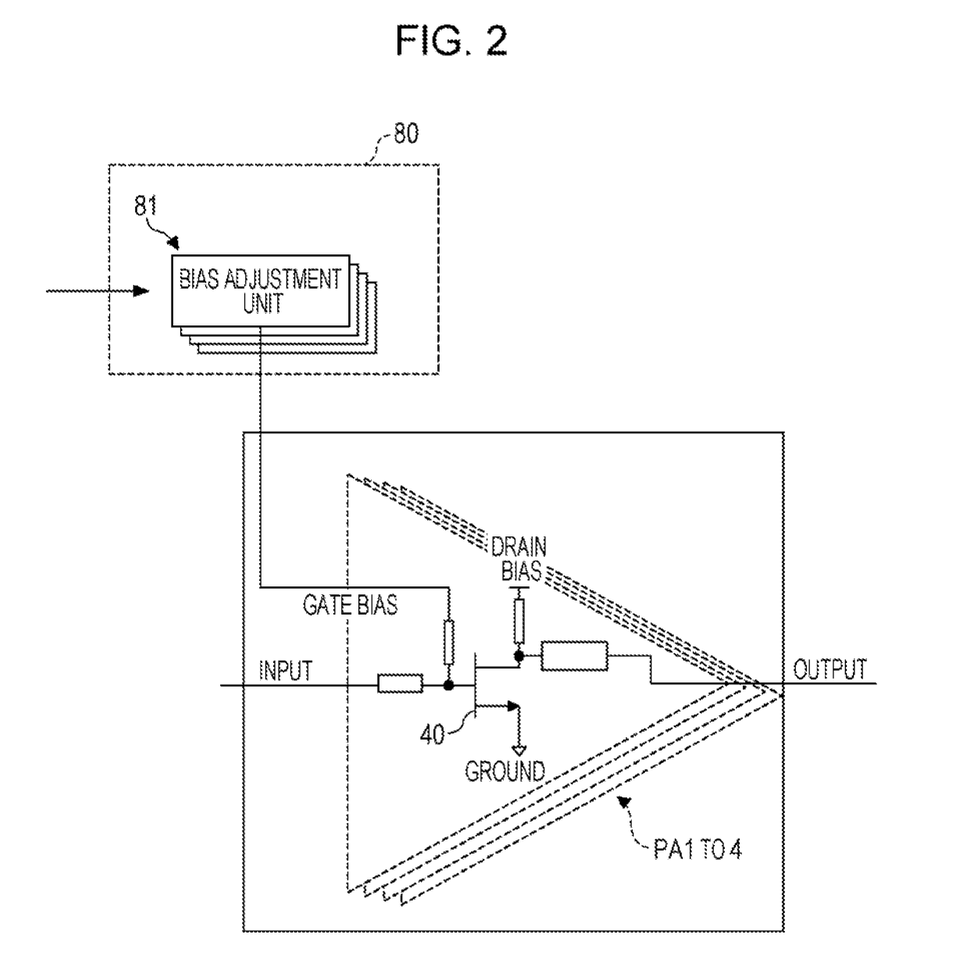
FIG. 2 is a diagram illustrating a configuration example of an amplifier and a bias application unit.

FIG. 2 is a diagram illustrating a configuration example of the amplifier and the bias application unit. The bias application unit 80 preferably includes a bias adjustment section 81 able to independently control (adjust) a bias applied to each PA in such a manner as to uniform the distortion characteristics of each of the plurality of PAs with high precision.

Each PA includes a transistor 40 used for amplification. When a gate bias applied to the gate of the transistor 40 is changed, the distortion characteristics of the PA including the transistor 40 are systematically changed. For example, when the gate bias is decreased, the AM-AM distortion is increased, and when the gate bias is increased, the AM-PM distortion is increased. That is, the bias application unit 80 adjusts the gate bias applied to each PA to an appropriate value, thereby making it possible to uniform the distortion characteristics of each of the plurality of PAs.

When a drain bias applied to the drain of the transistor 40 is changed, the distortion characteristics of the PA including the transistor 40 may change systematically. In this case, the arithmetic circuit 19 may control the drain bias to be applied by the bias application unit 80 in such a manner as to uniform the distortion characteristics of each of the plurality of PAs. Moreover, the arithmetic circuit 19 may control both the gate bias and the drain bias or may control only one of the gate bias and the drain bias, by the bias application unit 80.

Figure 3:
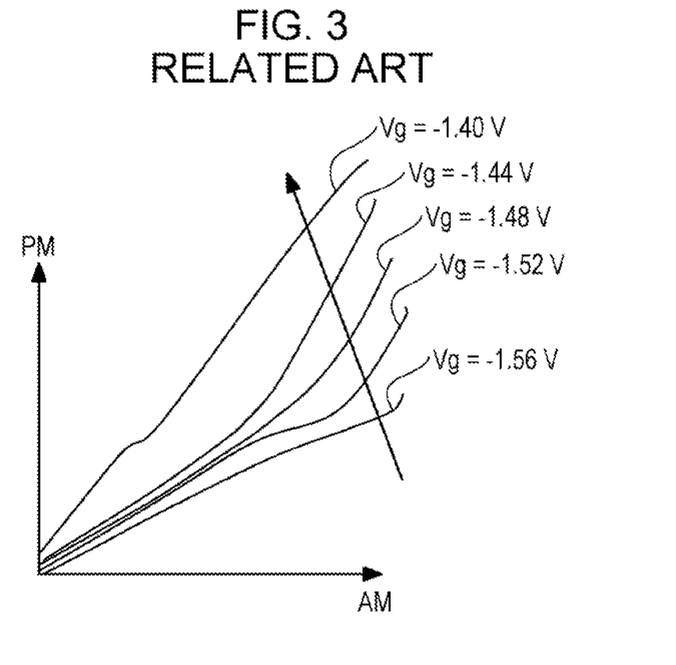
FIG. 3 is a graph exemplifying distortion characteristics of an amplifier.
Figure 4:
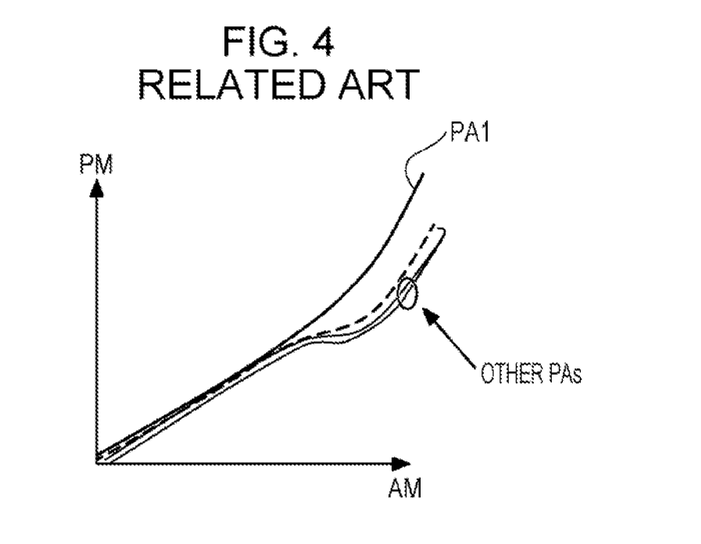
FIG. 4 is a graph exemplifying a state in which distortion characteristics of each of a plurality of amplifiers are not uniform.
Figure 5:
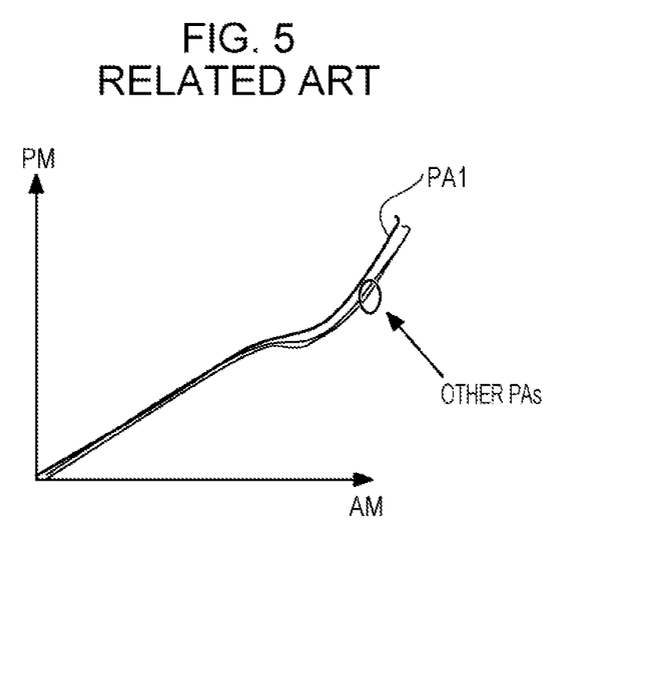
FIG. 5 is a graph exemplifying a state in which distortion characteristics of each of a plurality of amplifiers are substantially uniform.

FIG. 3 is a graph exemplifying distortion characteristics of an amplifier, and more specifically, is a diagram exemplifying an AM-PM distortion, which is one type of distortion characteristics of the PA 1. FIG. 3 exemplifies a case in which the AM-PM distortion of the PA 1 varies systematically depending on a difference in a gate bias Vg of the transistor 40 in the PA 1. FIG. 4 is a graph exemplifying a state in which distortion characteristics of each of a plurality of amplifiers are not uniform, and more specifically, exemplifies an AM-PM distortion of each of the PAs 1 to 4 detected by the characteristic detection unit 17. In the cases as illustrated in FIGS. 3 and 4, the arithmetic circuit 19 lowers the gate bias Vg applied to the PA 1 by the bias application unit 80 from −1.48 V to-1.52 V, whereby the distortion characteristics of the PA 1 may be brought close to the distortion characteristics of the other PAs, that is, PA 2 to PA 4, as illustrated in FIG. 5. As a result, mutual similarities among the distortion characteristics of each of the PAs 1 to 4 are improved, thereby making it possible to uniform the distortion characteristics of each of the plurality of PAs.

In this manner, the arithmetic circuit 19 in FIG. 1 may control the bias to be applied to a PA having distortion characteristics with the lowest similarity among the distortion characteristics of each of the plurality of PAs detected by the characteristic detection unit 17, so that the distortion characteristics with the lowest similarity may approach the other distortion characteristics. As a result, the distortion characteristics of each of the plurality of PAs become quickly uniform, so that the distortion compensation processing performed by the compensation processing unit 12 may quickly reduce the distortion of the signal outputted from each of the plurality of PAs.

Further, the arithmetic circuit 19 may control the phase shift amount to be adjusted by at least one phase shifter among the plurality of phase shifters 31 to 34 in such a manner as to uniform the distortion characteristics of each of the PAs 1 to 4 detected by the characteristic detection unit 17 of the distortion detection unit 91. By controlling at least one phase shift amount in such a manner as to make uniform the distortion characteristics of each of the plurality of PAs detected by the characteristic detection unit 17 of the distortion detection unit 91, the distortion of the signal outputted from each of the plurality of PAs may be effectively reduced by the single distortion compensation unit 16 common to the plurality of PAs.

Figure 6:
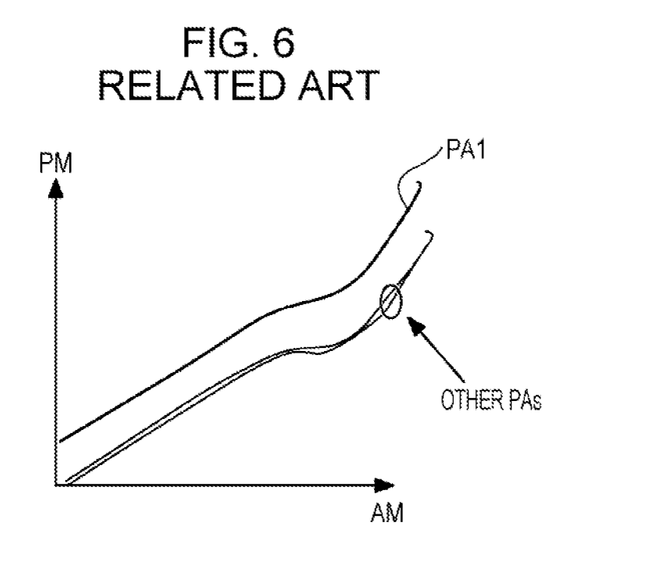
FIG. 6 is a graph exemplifying a state in which distortion characteristics of each of a plurality of amplifiers are not uniform.

For example, FIG. 6 is a graph exemplifying a state in which distortion characteristics of each of a plurality of amplifiers are not uniform, and more specifically, exemplifies an AM-PM distortion of each of the PAs 1 to 4 detected by the characteristic detection unit 17. FIG. 6 exemplifies a case in which the AM-PM distortion of the PA 1 is offset as a whole relative to the AM-PM distortions of the other PAs, that is, PAs 2 to 4. In the case as illustrated in FIG. 6, the arithmetic circuit 19 adjusts the phase shift amount to be adjusted by the phase shifter 31 in the front stage of the PA 1, so that the distortion characteristics of the PA 1 may be brought close to the distortion characteristics of the other PAs, that is, PAs 2 to 4, as illustrated in FIG. 5. As a result, mutual similarities among the distortion characteristics of each of the PAs 1 to 4 are improved, thereby making it possible to uniform the distortion characteristics of each of the plurality of PAs.

In this manner, the arithmetic circuit 19 in FIG. 1 may control the phase shift amount adjusted by the phase shifter in the front stage of a PA having distortion characteristics with the lowest similarity among the distortion characteristics of each of the plurality of PAs detected by the characteristic detection unit 17, in such a manner that the distortion characteristics with the lowest similarity are brought close to the other distortion characteristics. As a result, the distortion characteristics of each of the plurality of PAs become quickly uniform, so that the distortion compensation processing performed by the compensation processing unit 12 may quickly reduce the distortion of the signal outputted from each of the plurality of PAs.

In order to make the distortion characteristics of each of the PAs uniform, only one of the control of the bias to be applied to the PA and the control of the phase shift amount adjusted by the phase shifter may be performed, or both of them may be performed.

As discussed above, the characteristic detection unit 17 detects the distortion characteristics of each of the PAs 1 to 4 based on a difference between the baseband signal supplied from the baseband processor 11 and the feedback signal supplied from the ADC 15. At this time, the characteristic detection unit 17 may generate distortion characteristic data representing the detected distortion characteristics for each of the PAs 1 to 4, and may store the generated distortion characteristic data of each of the PAs 1 to 4 in the memory 18. The arithmetic circuit 19 may control the bias applied to at least one PA among the PAs 1 to 4 or may control the phase shift amount adjusted by at least one of the phase shifters 31 to 34, in such a manner that the distortion characteristic data of each of the PAs 1 to 4 stored in the memory 18 is equal to each other.

Specific examples of the distortion characteristic data representing the distortion characteristics of the PA include phase data of the output signal of the PA, amplitude data of the output signal of the PA, phase change rate data of the output signal with respect to the amplitude change of the input signal of the PA, and amplitude change rate data of the output signal with respect to the amplitude change of the input signal of the PA.

In order to make these characteristic data equal to each other among the plurality of PAs, the arithmetic circuit 19 may control the bias to be applied to at least one PA among the PAs 1 to 4, or may control the phase shift amount adjusted by at least one of the phase shifters 31 to 34. As a result, the distortion characteristics of each of the plurality of PAs may be uniform.

The characteristic detection unit 17 calculates predistortion data such as a distortion compensation coefficient based on a difference between the baseband signal supplied from the baseband processor 11 and the feedback signals sequentially supplied one by one from the ADC 15. The predistortion data is data to be used in order for the compensation processing unit 12 to provide, to the baseband signal, distortion characteristics opposite to the distortion characteristics of the signal outputted from each of the PAs 1 to 4. Since the distortion characteristics of each of the PAs are made substantially uniform by the above-described control, the distortion of the signal outputted from each of the plurality of PAs may be sufficiently reduced even when distortion compensation is performed by using the predistortion data calculated based on the feedback signals sequentially supplied one by one from the ADC 15.

A generation method for the predistortion data includes a known look-up table (LUT) method. However, the generation method is not limited thereto.

Figure 7:
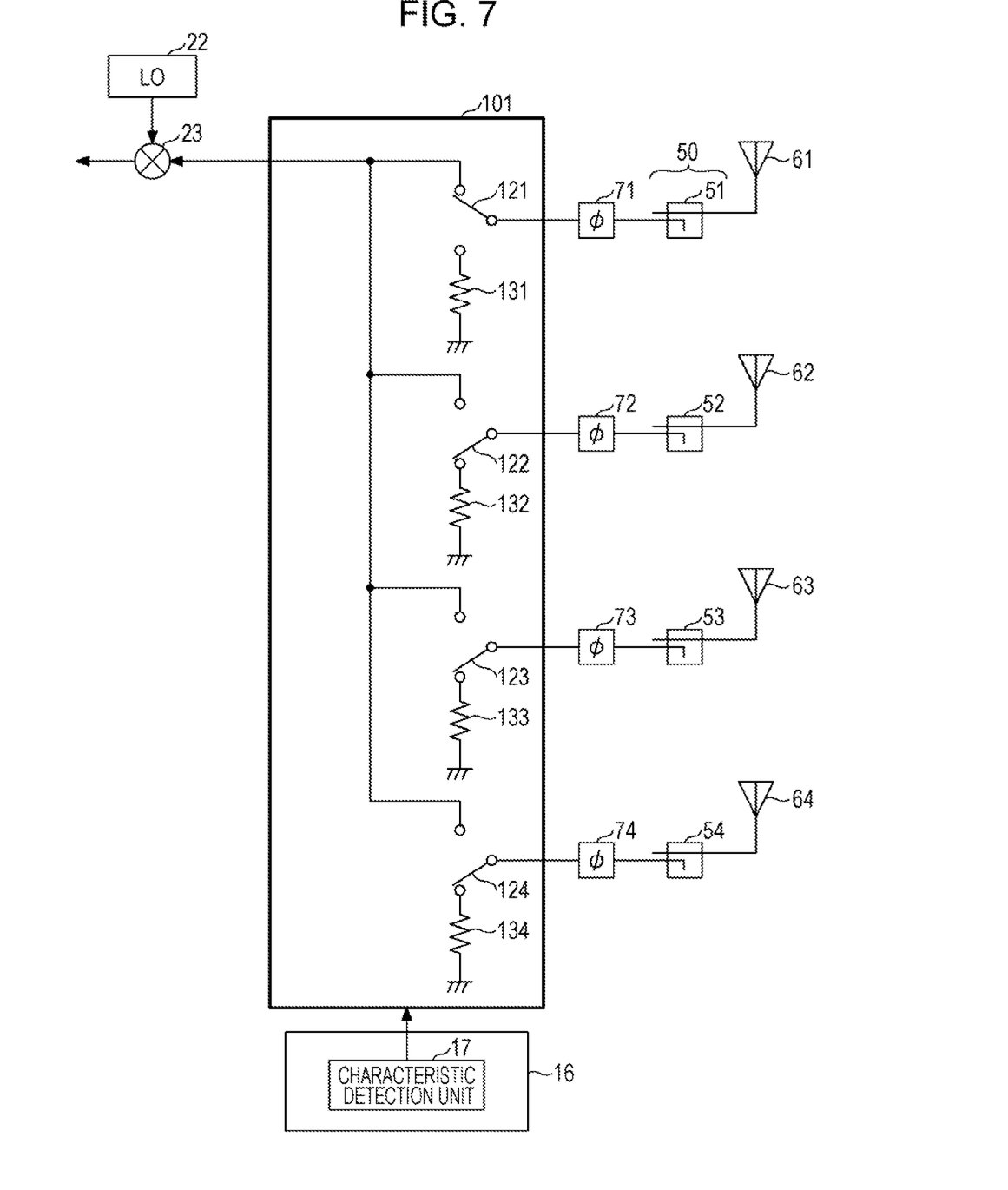
FIG. 7 is a diagram illustrating a first configuration example of a selection unit.

FIG. 7 is a diagram illustrating a first configuration example of the selection unit. The selection unit 101 illustrated in FIG. 7 is a switch array circuit constituted by a combination of a plurality of single-pole double-throw switches 121 to 124. Termination resistors 131 to 134 are coupled to the single-pole double-throw switches 121 to 124, respectively. Based on a selection signal given from the characteristic detection unit 17 of the distortion compensation unit 16, only one switch among the plurality of single-pole double-throw switches 121 to 124 is coupled to a side of the down-converter 23, and the remaining switches are coupled to a side of the termination resistors. Thus, the selection unit 101 is able to sequentially select a plurality of feedback signals one by one based on the selection signal given from the characteristic detection unit 17 of the distortion detection unit 91. Since the not-selected remaining feedback signals are coupled to the termination resistors, the reflection of the remaining feedback signals may be suppressed.

Figure 8:
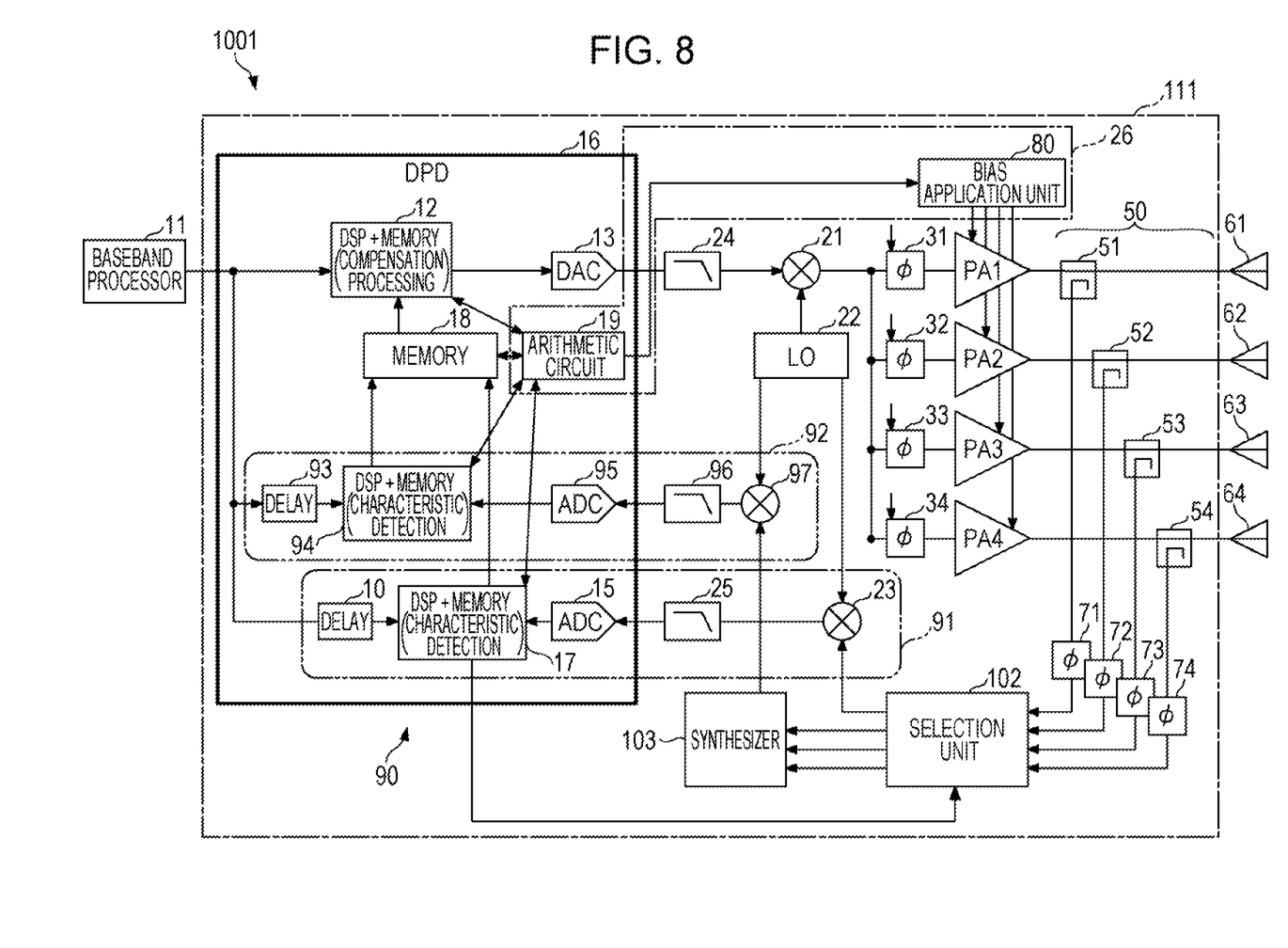
FIG. 8 is a diagram illustrating a configuration example of an antenna device according to a second embodiment.

FIG. 8 is a diagram illustrating a configuration example of an antenna device according to a second embodiment. Description of the same configuration and effect as those of the above-described embodiment will be omitted or simplified by incorporating the foregoing description. An antenna device 1001 illustrated in FIG. 8 also has a configuration in which distortion characteristics of each of a plurality of PAs are uniform. The antenna device 1001 includes a power amplifier circuit 111, a plurality of antennas 61 to 64, and a baseband processor 11. The power amplifier circuit 111 includes a detection unit 90 configured to detect distortion characteristics of each of a plurality of PAs 1 to 4. The detection unit 90 illustrated in FIG. 8 includes an extraction unit 50, phase shifters 71 to 74, a selection unit 102, a synthesizer 103, and distortion detection units 91 and 92.

The distortion detection unit 91 selects a plurality of feedback signals by the selection unit 102 one by one, and compares a baseband signal with one signal selected by the selection unit 102 from among the plurality of feedback signals, thereby detecting first distortion characteristics corresponding to the above one signal. The first distortion characteristics represent the distortion characteristics of the PA corresponding to the one signal.

The synthesizer 103 performs composite operation on other signals different from the one signal among the plurality of feedback signals. For example, when a feedback signal of the PA 1 is selected by the selection unit 102, the synthesizer 103 performs composite operation on three feedback signals of the remaining PAs, that is, PAs 2 to 4. In the case where a feedback signal of another PA is selected, the composite operation is similarly performed on the feedback signals of the remaining PAs.

The distortion detection unit 92 compares the baseband signal with a composite signal obtained by the composite operation of the synthesizer 103, thereby detecting second distortion characteristics corresponding to the other signals. The second distortion characteristics represent distortion characteristics obtained by averaging the distortion characteristics of each of the remaining three PAs corresponding to the other signals.

Accordingly, by sequentially switching the feedback signals selected by the selection unit 102 one by one, not only the individual distortion characteristics of the PAs 1 to 4 may be detected by the distortion detection unit 91, but also the average distortion characteristics of the PAs 1 to 4 as a whole may be detected by the distortion detection unit 92. With the above configuration, it is possible to acquire the distortion characteristics of each of the plurality of PAs in a circuit scale of two distortion detection units (without preparing the same number of distortion detection units as the number of the plurality of PAs).

A control unit 26 controls at least one of the bias or the phase shift amount so that the first distortion characteristics and the second distortion characteristics are uniform. With this, even when a single distortion compensation unit 16 common to the plurality of PAs performs distortion compensation, distortion of the signal outputted from each of the plurality of PAs may be sufficiently reduced. For example, the control unit 26 determines whether or not a difference between distortion characteristic data representing the first distortion characteristics and distortion characteristic data representing the second distortion characteristics is equal to or greater than a predetermined threshold value. When it is determined that the difference is equal to or greater than the predetermined threshold value, the control unit 26 changes the bias of a PA having the first distortion characteristics or changes the phase shift amount of the phase shifter in the front stage of the stated PA, thereby making it possible to quickly equalize the distortion characteristics of the PA with the distortion characteristics of the remaining PAs.

Figure 9:
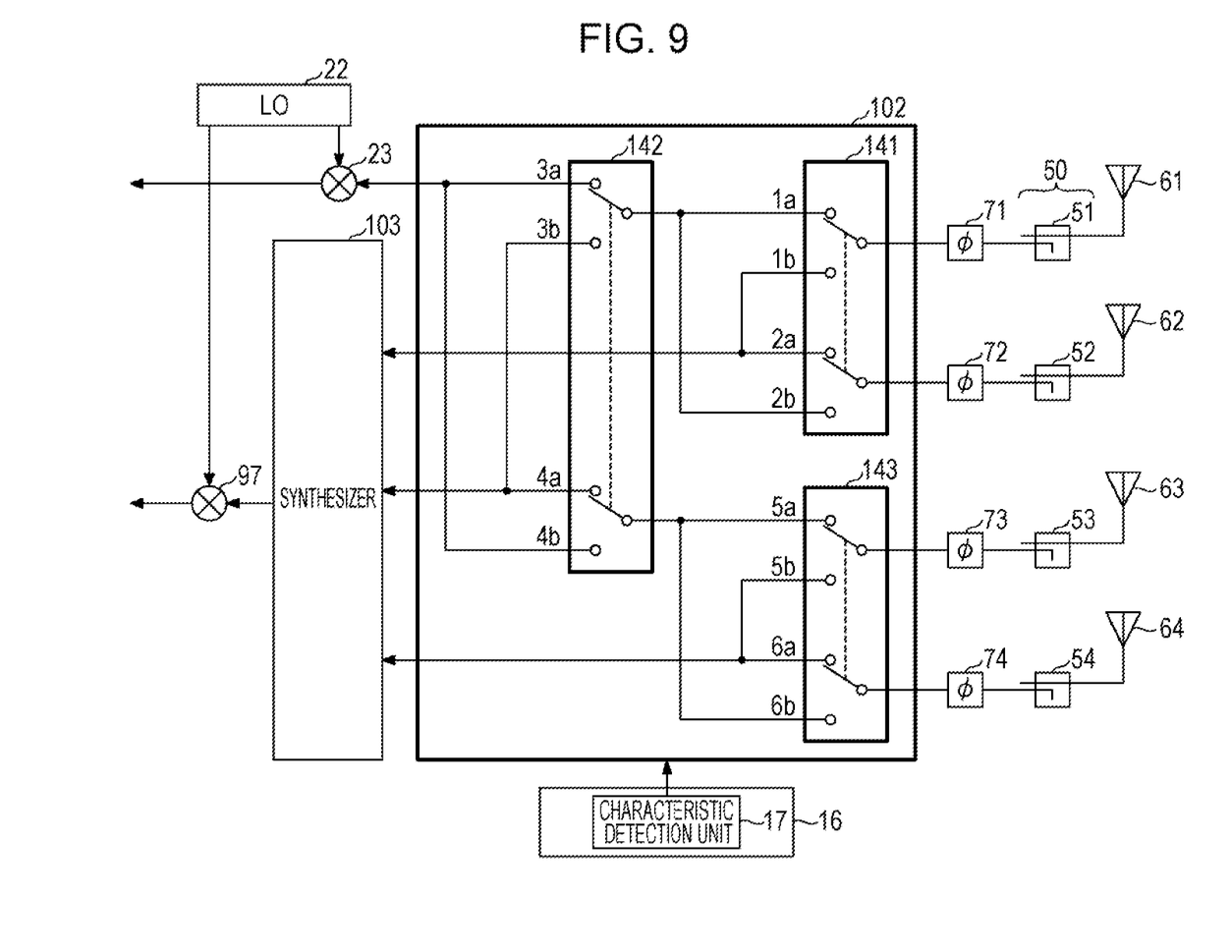
FIG. 9 is a diagram illustrating a second configuration example of a selection unit.

FIG. 9 is a diagram illustrating a second configuration example of the selection unit. The selection unit 102 illustrated in FIG. 9 is a switch array circuit constituted by a combination of a plurality of double-pole double-throw switches 141 to 143. Based on a selection signal given from a characteristic detection unit 17 of the distortion compensation unit 16, one signal among the plurality of feedback signals is transferred to a side of a down-converter 23, and the remaining signals are transferred to the synthesizer 103, by the switching operation of the plurality of double-pole double-throw switches 141 to 143.

As discussed above, according to the present embodiment, since the distortion characteristics of each of the PAs are made substantially uniform, the distortion compensation unit 16 is able to compensate for the distortion of the signal outputted from each of the plurality of PAs 1 to 4, based on the signals sequentially outputted from one arbitrary PA among the plurality of PAs 1 to 4. Accordingly, it is possible to adjust the overall distortion characteristics by the distortion compensation unit 16 common to the plurality of PAs.

Although the power amplifier circuit and the antenna device have been described thus far based on the embodiments, the present disclosure is not limited to the above-described embodiments. Various modifications and improvements, such as combinations or replacement with some or all of other embodiments, are possible within the scope of the present disclosure.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A power amplifier circuit comprising:
a plurality of amplifiers;
a plurality of couplers each configured to extract a signal from an output signal of each of the plurality of amplifiers;
a selector configured to select a signal from extracted signals by the plurality of couplers;
a detector configured to detect distortion characteristics of each of the plurality of amplifiers;
a control circuit configured to control a bias voltage to be applied to at least one amplifier of the plurality of amplifiers so that the distortion characteristics of each of the plurality of amplifiers detected by the detector are matched; and
a distortion compensator configured to perform distortion compensation for the plurality of amplifiers, based on the distortion characteristics of each of the plurality of amplifiers detected by the detector,
wherein the detector detects distortion characteristics of each of the plurality of amplifiers by comparing the selected signal by the selector with a baseband signal before being distributed to each of the plurality of amplifiers, and
wherein the detector includes:
a first distortion detector configured to detect first distortion characteristics corresponding to the selected signal by comparing the baseband signal with the selected signal,
a synthesizer configured to synthesize other signals different from the selected signal of the plurality of signals to a synthesized signal, and
a second distortion detector configured to detect second distortion characteristics corresponding to the synthesized signal by comparing the baseband signal with the synthesized signal.

2. The power amplifier circuit according to claim 1,
wherein the control circuit controls the bias voltage to be applied to the amplifier having the distortion characteristics with a lowest similarity among the distortion characteristics of each of the plurality of amplifiers detected by the detector.

3. The power amplifier circuit according to claim 1,
wherein the bias voltage is a gate bias voltage applied to a gate of a transistor included in the amplifier.

4. The power amplifier circuit according to claim 1, further comprising:
a first plurality of phase shifters each provided in a front stage of each of the plurality of amplifiers,
wherein the control circuit adjusts a phase shift amount of at least one phase shifter of the first plurality of phase shifters.

5. A power amplifier circuit comprising:
a plurality of amplifiers;
a plurality of couplers each configured to extract a signal from an output signal of each of the plurality of amplifiers;
a selector configured to select a signal from extracted signals by the plurality of couplers;
a detector configured to detect distortion characteristics of each of the plurality of amplifiers;
a first plurality of phase shifters each provided in a front stage of each of the plurality of amplifiers;
a second plurality of phase shifters each provided between each of the plurality couplers and the selector and configured to operate complementarily to each of the first plurality of phase shifters;
a control circuit configured to adjust a phase shift amount of at least one phase shifter of the first plurality of phase shifters so that the distortion characteristics of each of the plurality of amplifiers detected by the detector are matched; and
a distortion compensator configured to perform distortion compensation for the plurality of amplifiers, based on the distortion characteristics of each of the plurality of amplifiers detected by the detector,
wherein the detector detects distortion characteristics of each of the plurality of amplifiers by comparing the selected signal by the selector with a baseband signal before being distributed to each of the plurality of amplifiers.

6. The power amplifier circuit according to claim 5,
wherein the control circuit adjusts the phase shift amount of at least one phase shifter of the plurality of phase shifters provided in a front stage of the amplifier having the distortion characteristics with a lowest similarity among the distortion characteristics of each of the plurality of amplifiers detected by the detector.

7. The power amplifier circuit according to claim 1,
wherein the control circuit controls the bias voltage so that the first distortion characteristics and the second distortion characteristics are matched.

8. The power amplifier circuit according to claim 1,
wherein the selector is formed by a combination of a plurality of double-pole double-throw switches.

9. The power amplifier circuit according to claim 1,
wherein the selector is formed by a combination of a plurality of single-pole double-throw switches.

10. The power amplifier circuit according to claim 4, further comprising:
a second plurality of phase shifters each provided between each of the plurality couplers and the selector and configured to operate complementarily to each of the first plurality of phase shifters.

11. An antenna device comprising:
a plurality of antennas;
a plurality of amplifiers each provided with each of the plurality of antennas;
a baseband signal generator configured to generate a baseband signal to be distributed to each of the plurality of amplifiers;
a plurality of couplers each configured to extract a signal from an output signal of each of the plurality of amplifiers;
a selector configured to select a signal from extracted signals by the plurality of couplers;
a first plurality of phase shifters each provided in a front stage of each of the plurality of amplifiers;
a second plurality of phase shifters each provided between each of the plurality couplers and the selector and configured to operate complementarily to each of the first plurality of phase shifters;
a detector configured to detect distortion characteristics of each of the plurality of amplifiers;
a control circuit configured to control a bias voltage to be applied to at least one amplifier of the plurality of amplifiers so that the distortion characteristics of each of the plurality of amplifiers detected by the detector are matched; and
a distortion compensator configured to perform distortion compensation for the plurality of amplifiers, based on the distortion characteristics of each of the plurality of amplifiers detected by the detector,
wherein the detector detects distortion characteristics of each of the plurality of amplifiers by comparing the selected signal by the selector with the baseband signal, and
wherein the control circuit adjusts a phase shift amount of at least one phase shifter of the first plurality of phase shifters.

* * * * *